United States Patent
Hayashi et al.

(10) Patent No.: US 8,480,319 B2
(45) Date of Patent: Jul. 9, 2013

(54) COATING AND DEVELOPING APPARATUS, COATING AND DEVELOPING METHOD AND NON-TRANSITORY TANGIBLE MEDIUM

(75) Inventors: Shinichi Hayashi, Koshi (JP); Yuichi Douki, Koshi (JP); Akira Miyata, Koshi (JP); Yuuichi Yamamoto, Tokyo-To (JP); Kousuke Yoshihara, Koshi (JP); Nobuaki Matsuoka, Koshi (JP); Suguru Enokida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 129 days.

(21) Appl. No.: 13/221,072

(22) Filed: Aug. 30, 2011

(65) Prior Publication Data
US 2012/0057862 A1    Mar. 8, 2012

(30) Foreign Application Priority Data

Sep. 2, 2010   (JP) .................................. 2010-197069

(51) Int. Cl.
*G03D 5/00*        (2006.01)
(52) U.S. Cl.
USPC .......................... 396/611; 118/506; 438/800

(58) Field of Classification Search
USPC ........................... 396/611; 118/506; 438/800
See application file for complete search history.

(56) References Cited

U.S. PATENT DOCUMENTS

| 7,661,894 | B2 | 2/2010 | Matsuoka et al. | |
| 2008/0014333 | A1* | 1/2008 | Matsuoka et al. | 427/8 |
| 2011/0043773 | A1* | 2/2011 | Matsuoka | 355/27 |

FOREIGN PATENT DOCUMENTS

JP    2007-115831 A1    5/2007

* cited by examiner

*Primary Examiner* — W B Perkey
*Assistant Examiner* — Fang-Chi Chang
(74) *Attorney, Agent, or Firm* — Burr & Brown

(57) ABSTRACT

A process block is formed by arranging a heating-process related block on the side of a carrier block, a group of liquid-process related unit blocks, and a heating block on the side of an interface block, in this order from the side of the carrier block to the side of the interface block. The group of liquid-process related unit blocks is composed of: a group of unit blocks for coating films that is formed by stacking upward a unit block for an antireflection film, a unit block for a resist film, and a unit block for an upper layer film, in this order; and unit blocks for developing that are stacked on one another in the up and down direction with respect to the group of unit blocks for coating films. Liquid process modules of each of the liquid-process related unit blocks are arranged on the right and left sides of a transfer path for a substrate.

8 Claims, 13 Drawing Sheets

US 8,480,319 B2

COATING AND DEVELOPING APPARATUS, COATING AND DEVELOPING METHOD AND NON-TRANSITORY TANGIBLE MEDIUM

CROSS-REFERENCE TO RELATED APPLICATION

This application is based on and claims the benefit of priority to Japanese Patent Application No. 2010-197069 filed on Sep. 2, 2010, the entire contents of which are incorporated herein by reference.

FIELD OF THE INVENTION

The present invention relates to a coating and developing apparatus, a coating and developing method and a non-transitory tangible medium, for forming a resist onto a substrate and developing the resist after exposure.

BACKGROUND ART

In a photolithography process which is one of semiconductor manufacturing processes, a resist is coated onto a surface of a semiconductor wafer (hereinafter referred to as "wafer"), the resist is exposed in a predetermined pattern, and then the resist is developed to form a resist pattern. A coating and developing apparatus for forming such a resist pattern is equipped with a process block including process modules for subjecting the wafer to various kinds of processes.

As described in JP2007-115831A, for example, the process block is structured by stacking unit blocks that form various kinds of coating films such as a resist film, and a unit block that performs a developing process, on one another. Each of the unit blocks is provided with a wafer transfer mechanism. A wafer is sequentially transferred by the transfer mechanism to a process module disposed in each unit block, and is subjected to a process.

In order to cope with miniaturization of a pattern to be formed in a wafer, a variety of process modules are provided to the coating and developing apparatus. For example, in addition to a resist-film forming module that forms a resist film on a wafer by supplying a resist onto the wafer, and a developing module that develops the resist by supplying a developing liquid onto the wafer, the coating and developing apparatus sometimes includes a module that forms an antireflection film below the resist film, a module that forms a protective film for immersion exposure on the wafer, and so on. It has been under review how to decrease an installation area of the coating and developing apparatus including these various kinds of modules.

In addition, in the coating and developing apparatus of JP2007-115831A, the wafer is sequentially transferred among the modules in respective layers. Thus, when one module cannot process the wafer, the wafer cannot be transferred to the succeeding module, which may lower a process efficiency. Thus, there has been desired a coating and developing apparatus having a small installation area, which is capable of preventing lowering of process efficiency.

SUMMARY OF THE INVENTION

The present invention has been made in view of the above circumstances. The object of the present invention is to provide a technique which can restrain lowering of process efficiency of a coating and developing apparatus, and can reduce an installation area of the apparatus.

In one embodiment, there is provided a coating and developing apparatus including: a carrier block; a process block to which a substrate that has been loaded into the carrier block by a carrier is delivered, the process block being configured to form a coating film including a resist film on the substrate; an interface block arranged on an opposed side of the carrier block with respect to the process block; and an exposure apparatus configured to expose the substrate that has been transferred thereto from the process block via the interface block; the substrate that has been loaded into the carrier block by the carrier is delivered to the process block, a coating film including a resist film is formed on the substrate in the process block, the substrate is transferred to the exposure apparatus via the interface block, the exposed substrate, which has been returned to the process block via the interface block, is developed in the process block, and the developed substrate is delivered to the carrier block; in the process block, a heating-process related block on the side of the carrier block, a group of liquid-process related unit blocks, and a heating block on the side of the interface block, are arranged in this order from the side of the carrier block to the side of the interface block; the group of liquid-process related unit blocks are composed of: a group of unit blocks for coating films that is formed by stacking upward a unit block for an antireflection film configured to form an antireflection film on a substrate, a unit block for a resist film configured to form a resist film on the antireflection film, and a unit block for an upper layer film configured to form an upper layer film on the resist film, in this order; and unit blocks for developing that are stacked on one another in the up and down direction with respect to the group of unit blocks for coating films, each unit block for developing being configured to develop an exposed substrate; when a direction along which the interface block is seen from the carrier block is supposed to be seen from the front, each unit block of the group of unit blocks for coating films includes: a linear transfer path extending in the back and forth direction; liquid process modules arranged on the right and left sides of the linear transfer path, each liquid process module being configured to supply a substrate with a chemical liquid corresponding to each coating film; and a main transfer mechanism configured to be moved along the linear transfer path so as to transfer a substrate between these liquid process modules; the unit block for developing includes: a linear transfer path extending in the back and forth direction; developing modules arranged on the right and left sides of the linear transfer path, each developing module being configured to supply a substrate with a developing liquid; and a main transfer mechanism configured to be moved along the linear transfer path so as to transfer a substrate between these developing modules; in the heating-process related block on the side of the carrier block, there are provided: a number of heating modules that are stacked in the up and down direction, in which a heating module configured to heat a substrate on which a chemical liquid has been coated in the unit block for a resist film, and a heating module configured to heat a substrate on which a developing liquid has been supplied in the unit block for developing are allocated to these heating modules; and an up and down transfer mechanism capable of being moved in the up and down direction so as to transfer a substrate among the heating modules; in the heating block on the side of the interface block, there are provided: a number of heating modules that are stacked in the up and down direction, in which a heating module configured to heat a substrate on which a chemical liquid has been coated in the unit block for an antireflection film, a heating module configured to heat a substrate on which a chemical liquid has been coated in the unit block for an upper layer film, and a heating module configured to heat an exposed substrate to which a developing liquid is not yet supplied in the unit block for developing are allocated to these heating modules; and an up and down transfer mechanism capable of being moved in the up and down direction so as to transfer a substrate among the heating modules; and the coating and developing apparatus further includes: delivery stages respectively arranged on the side of the carrier block of each unit block of the group of unit blocks for coating films, and on the side of the interface block thereof; delivery stages respectively arranged on the side of the carrier block of the unit block for developing, and on the side of the interface block thereof; a delivery mechanism configured to deliver a substrate, which has been taken out from the carrier placed on the carrier block, to the delivery stage on the side of the carrier block of the unit block for an antireflection film, and configured to receive a substrate from the delivery stage on the side of the carrier block of the unit block for developing; and a control unit configured to output a control signal in such a manner that a substrate on which a chemical liquid has been coated in the unit block for an antireflection film is delivered to the heating module on the side of the interface block so as to heat the substrate, then the substrate is delivered to the unit block for a resist film so as to coat the substrate with a chemical liquid, then the substrate is delivered to the heating module on the side of the carrier block so as to heat the substrate, then the substrate is delivered to the unit block for an upper layer film so as to coat the substrate with a chemical liquid, and then the substrate is delivered to the heating module on the side of the interface block so as to heat the substrate.

In another embodiment, there is provided a coating and developing method, employing the aforementioned coating and developing apparatus, the method including: coating a substrate with a chemical liquid for forming an antireflection film, in the unit block for an antireflection film; delivering the substrate on which the chemical liquid has been coated, to the heating module on the side of the interface block and heating the substrate; delivering the heated substrate to the unit block for a resist film and coating the substrate with a resist liquid; delivering the substrate on which the resist liquid has been coated, to the heating module on the side of the carrier block and heating the substrate; delivering the heated substrate to the unit block for an upper layer film and coating the substrate with a chemical liquid for forming an upper layer film; and delivering the substrate on which the chemical liquid has been coated, to the heating module on the side of the interface block and heating the substrate.

The concrete aspects of the coating and developing apparatus are as follows.

(1) The up and down transfer mechanism of the heating block on the side of the interface block is divided into an up and down transfer mechanism configured to receive a substrate from the delivery stage corresponding to the unit block for an antireflection film and to deliver a heated substrate to the delivery stage corresponding to the unit block for a resist film, and an up and down transfer mechanism configured to receive a substrate from the delivery stage corresponding to the unit block for an upper layer film.

(2) The main transfer mechanism is shared by the unit block for a resist film and the unit block for an upper layer film, instead of the configuration in which the main transfer mechanism is provided to each of the unit block for a resist film and the unit block for an upper layer film; and the control unit controls the apparatus in such a manner that, when an upper layer film is not formed on a substrate, a substrate on which a chemical liquid has been coated in the unit block for a resist film is delivered, via the delivery stage corresponding to the unit block for an upper layer film, to the heating block on the side of the interface block so as to heat the substrate.

In yet another embodiment, there is provided a coating and developing apparatus including: a carrier block; a process block to which a substrate that has been loaded into the carrier block by a carrier is delivered, the process block being configured to form a coating film including a resist film on the substrate; an interface block arranged on an opposed side of the carrier block with respect to the process block; and an exposure apparatus configured to expose the substrate that has been transferred thereto from the process block via the interface block; the substrate that has been loaded into the carrier block by the carrier is delivered to the process block, a coating film including a resist film is formed on the substrate in the process block, the substrate is transferred to the exposure apparatus via the interface block, the exposed substrate, which has been returned to the process block via the interface block, is developed in the process block, and the developed substrate is delivered to the carrier block; in the process block, a heating-process related block on the side of the carrier block, a group of liquid-process related unit blocks, and a heating block on the side of the interface block, are arranged in this order from the side of the carrier block to the side of the interface block; the group of liquid-process related unit blocks are composed of: a group of unit blocks for coating films that is formed by stacking upward a unit block for an antireflection film configured to form an antireflection film on a substrate, and a unit block for a resist film configured to form a resist film on the antireflection film, in this order; and unit blocks for developing that are stacked on one another in the up and down direction with respect to the group of unit blocks for coating films, each unit block for developing being configured to develop an exposed substrate; when a direction along which the interface block is seen from carrier block is supposed to be seen from the front, each unit block of the group of unit blocks for coating films includes: a linear transfer path extending in the back and fourth direction; liquid process modules arranged on the right and left sides of the linear transfer path, each liquid process module being configured to supply a substrate with a chemical liquid corresponding to each coating film; and a main transfer mechanism configured to be moved along the linear transfer path so as to transfer a substrate between these liquid process modules; the unit block for developing includes: a linear transfer path extending in the back and forth direction; developing modules arranged on the right and left sides of the linear transfer path, each developing module being configured to supply a substrate with a developing liquid; and a main transfer mechanism configured to be moved along the linear transfer path so as to transfer a substrate between these developing modules; the heating-process related block on the side of the carrier block includes: a number of heating modules stacked on one another in the up and down direction, each heating module being configured to heat a substrate to which a developing liquid has been supplied in the unit block for developing; and an up and down transfer mechanism capable of being moved in the up and down direction so as to transfer a substrate among these heating modules; in the heating block on the side of the interface block, there are provided: a number of heating modules that are stacked in the up and down direction, in which a heating module configured to heat a substrate on which a chemical liquid has been coated in the unit block for an antireflection film, a heating module configured to heat a substrate on which a chemical liquid has been coated in the unit block for a resist film; and a heating module configured to heat an exposed substrate to which a developing liquid is not yet supplied in the unit block for developing are allocated to these heating modules; and an up and down transfer mechanism capable of being moved in the up and down direction so as to transfer a substrate among the heating modules; and the coating and developing apparatus further includes: delivery stages respectively arranged on the side of the carrier block of the unit block for an antireflection film, and on the side of the interface block thereof; delivery stages respectively arranged on the side of the side of the carrier block of the unit block for a resist film, and on the side of the interface block thereof; delivery stages respectively arranged on the side of the carrier block of the unit block for developing, and on the side of the interface block thereof; a delivery mechanism configured to deliver a substrate, which has been taken out from the carrier placed on the carrier block, to the delivery stage on the side of the carrier block of the unit block for an antireflection film, and configured to receive a substrate from the delivery stage on the side of the carrier block of the unit block for developing; and a control unit configured to output a control signal in such a manner that a substrate on which a chemical liquid has been coated in the unit block for an antireflection film is delivered to the heating module on the side of the interface block so as to heat the substrate, then the substrate is delivered to the unit block for a resist film so as to coat the substrate with a chemical liquid, and then the substrate is delivered to the heating module on the side of the interface block so as to heat the substrate.

In yet another embodiment, there is provided a coating and developing method, employing the aforementioned coating and developing apparatus, the method including: delivering a substrate on which a chemical liquid has been coated in the unit block for an antireflection film, to the heating module on the side of the interface block and heating the substrate; and delivering the substrate to the unit block for a resist film and coating the substrate with a chemical liquid, and then delivering the substrate to the heating module on the side of the interface block and heating the substrate.

In yet another embodiment, there is provided a non-transitory tangible medium storing a computer program for use in a coating and developing apparatus, the computer program being a program for performing the aforementioned coating and developing method.

In a process block constituting a coating and developing apparatus of the present invention, a heating-process related block, and a group of liquid-process related unit blocks, and a heating block are arranged in this order from the side of a carrier block to the side of a interface block. The group of liquid-process related unit blocks is formed by stacking a group of unit blocks for coating films and a unit block for developing. The group of liquid-process related unit blocks is formed by stacking upward a unit block for an antireflection film, a unit block for a resist film, and a unit block for an upper layer film, in this order. Modules of these unit blocks are arranged on the right and left sides of a transfer path extending from the carrier block to the interface block. Due to the arrangement of the respective blocks and the respective unit blocks, an installation area of the apparatus can be reduced. In addition, when one of the modules of each liquid-process related unit block is unavailable, a process can be performed by the other module. Thus, lowering of process efficiency can be restrained.

DETAILED DESCRIPTION OF THE INVENTION (First Embodiment)

Figure 1:
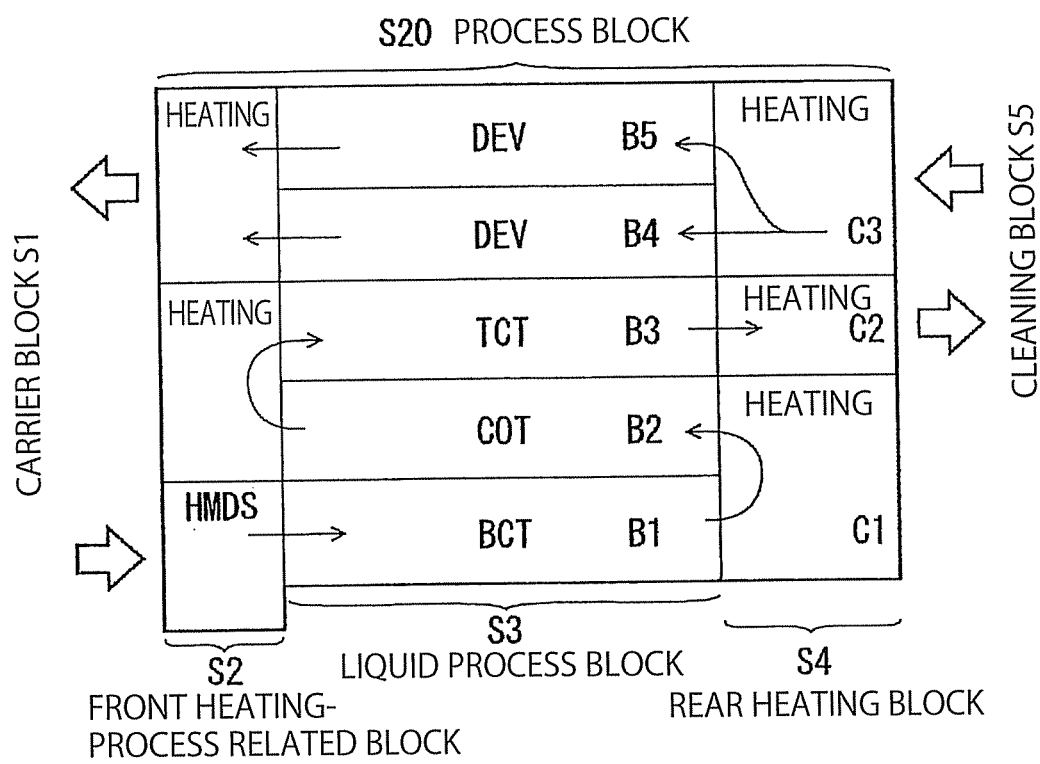
FIG. 1 is schematic side view of a process block constituting a coating and developing apparatus of the present invention.

A coating and developing apparatus 1 according to the present invention will be described. FIG. 1 is a schematic side view of the coating and developing apparatus 1 of the present invention. In the coating and developing apparatus 1, a carrier block S1, a process block S20, a cleaning block S5, and an interface block S6 are linearly connected to each other. An exposure apparatus S7 for performing an immersion exposure process is connected to the interface block S6. The process block S20 is composed of a front heating-process related block S2, a liquid process block S3 and a rear heating block S4, which are arranged from a side of the carrier block S1 to a side of the cleaning block S5.

The liquid process block S3 is structured by stacking upward first to fifth liquid-process unit blocks B1 to B5 each for performing a liquid process to a wafer W, in this order. The respective liquid-process unit block B1 to B5 are separated from each other by partition walls. Each of the liquid-process unit block B1 to B5 includes a liquid process module that performs a liquid process to a semiconductor wafer (hereinafter referred to as "wafer") W. Namely, the liquid-process unit block B1 includes an antireflection-film forming module BCT, the liquid-process unit block B2 includes a resist-film forming module COT, and the liquid-process unit block 83 includes a protective-film forming module TCT. The liquid-process unit blocks B4 and 85 include developing modules, respectively.

The rear heating block S4 is structured by stacking upward first to third heating-process unit blocks C1 to C3, in this order. The respective heating-process unit blocks C1 to C3 are separated from each other by partition walls. The heating-process unit block C1 is adjacent to the liquid-process unit block B1 and B2. The heating-process unit block C2 is adjacent to the liquid-process unit blocks B3, and the heating-process unit block C3 is adjacent to the liquid-process unit block B4 and B5. Each of the heating-process unit blocks C1 to C3 includes a heating module for heating the wafer W.

The arrows in FIG. 1 show a transfer route of the wafer W. The wafer W, which has been subjected to a hydrophobing process by a HMDS gas in the front heating-process related block S2, is transferred to the first liquid-process unit blocks B1, and an antireflection film is formed on the wafer W in the first liquid-process unit blocks B1. Then, the wafer W is subjected to a heating process in the first heating-process unit block C1, and a resist film is formed on the antireflection film in the second liquid-process unit block B2. The wafer W, on which the resist film has been formed, is transferred to the front heating-process related block S2, and is subjected to a heating process in the front heating-process related block S2. Thereafter, the wafer W is transferred to the third liquid-process unit blocks B3, and a protective film as an upper layer is formed on the resist film in the third liquid-process unit blocks B3. This protective film is water repellent, and thus has a function for preventing a liquid from permeating the resist film and the antireflection film, upon an immersion exposure process. The wafer W, on which the protective film has been formed, is subjected to a heating process in the second heating-process unit block C2. After that, the wafer W is transferred to the cleaning block S5 and the interface block S6 in this order, and is then loaded into the exposure apparatus S7.

The wafer W, which has been subjected to an exposure process in the exposure apparatus S7, is transferred to the interface block S6 and the cleaning block S5 in this order. Thereafter, the wafer W is transferred to the third heating-process unit block C3, and is subjected to a heating process in the third heating-process unit block C3. After that, the wafer W is transferred to the fourth liquid-process unit block B4 or the fifth liquid-process unit block B5, and is subjected to a developing process in the fourth or fifth liquid-process unit block B4 or B5. Subsequently, the wafer W is subjected to a heating process in the front heating-process related block S2, and is then returned to the carrier block S1.

In the coating and developing apparatus 1, the wafer W is transferred in one direction between the front heating-process related block S2 and the rear heating process block S4 through the layers at the same height. For each time when the wafer W is transferred to the front heating-process related block S2 and the rear heating block S4, the wafer W is transferred to the upside layer by the front heating-process related block S2 and the rear heating block S4. Due to this structure, the number of transfer times of the wafer W among the respective blocks can be reduced so as to improve a process efficiency, and the number of the below-described delivery modules can be reduced.

Figure 2:
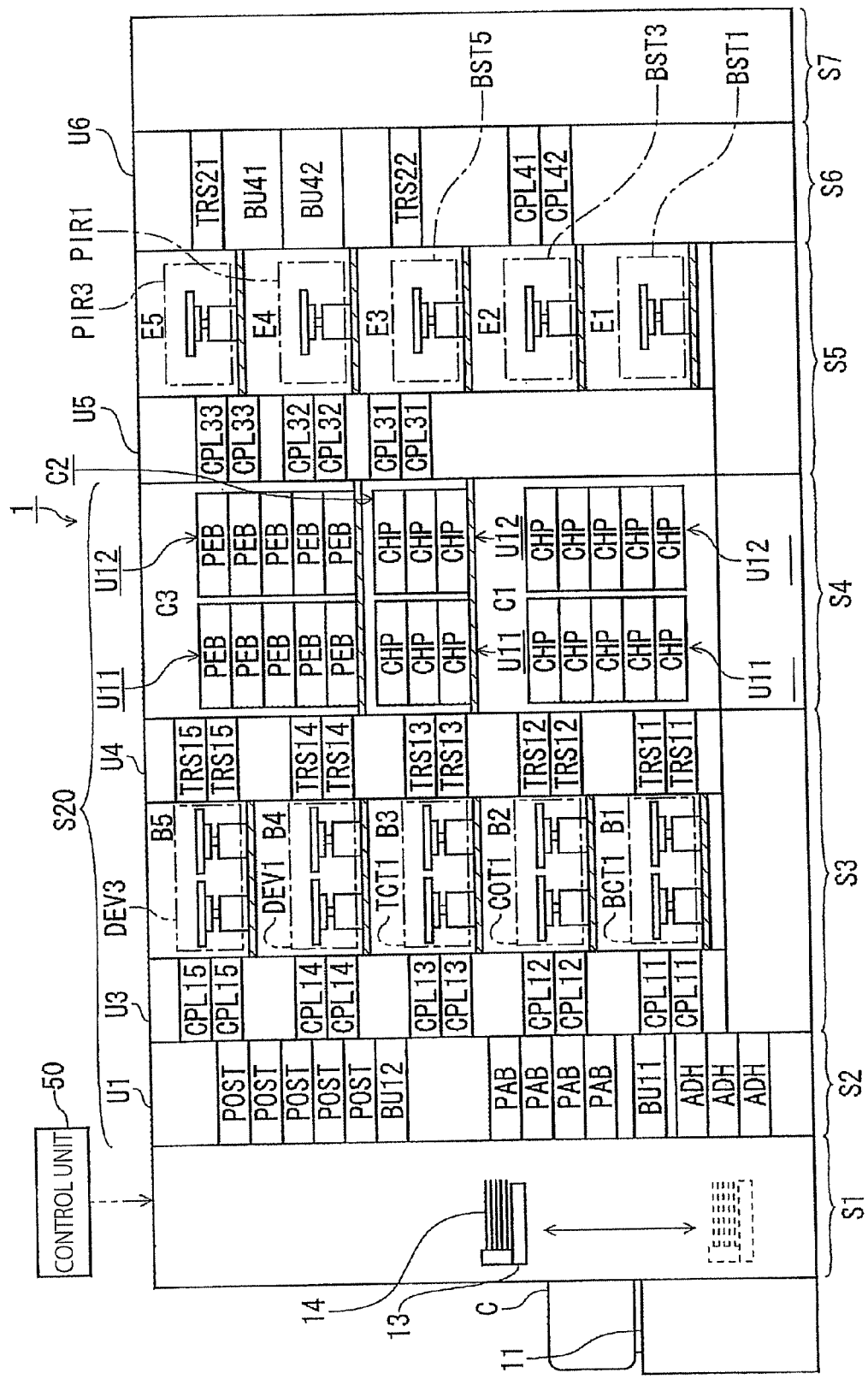
FIG. 2 is a longitudinal sectional view of the coating and developing apparatus.
Figure 3:
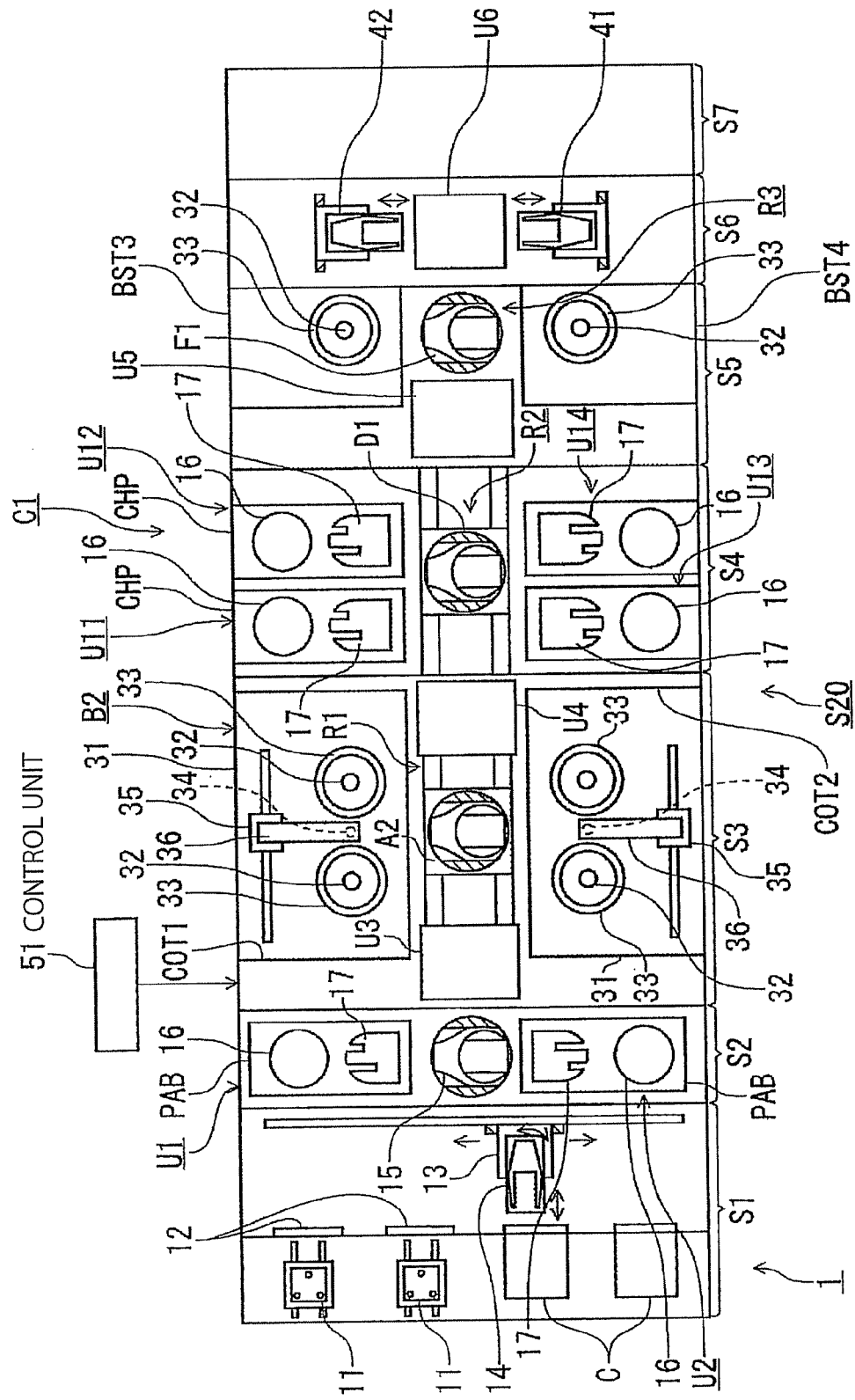
FIG. 3 is a plan view of the coating and developing apparatus.

Next, the structure of the coating and developing apparatus 1 will be explained in detail, with reference to FIG. 2 showing a plan view of the coating and developing apparatus 1 and FIG. 3 showing a longitudinal side view thereof. The carrier block S1 is a block through which wafers are loaded and unloaded to and from a carrier C hermetically accommodating a plurality of wafers W, e.g., twenty five wafers W as substrates. The carrier block S1 includes a table 11 on which the carrier C is placed, an opening and closing part 12 formed in a wall surface in front of the table 11, and a delivery arm 13 serving as a delivery mechanism that takes out the wafer W from the carrier C via the opening and closing part 12.

The delivery arm 13 has five wafer holders 14 arranged in an up and down direction. The delivery arm 13 is configured to be movable forward and rearward, movable upward and downward, rotatable about a vertical axis, and movable in a direction along which the carriers C are arranged. The delivery arm 13 is adapted to deliver the five wafers W as a batch from the carrier C to the delivery module BU11 of the process block S20. Herein, a place on which the wafer W can be placed is referred to as "module". Among these modules, the module configured to perform a process, such as a heating process, a liquid process, a gas supplying process and so on, to the wafer W is referred to as "process module". Among these process modules, the module configured to supply a chemical liquid or a cleaning liquid to the wafer W is referred to as "liquid process module".

Figure 4:
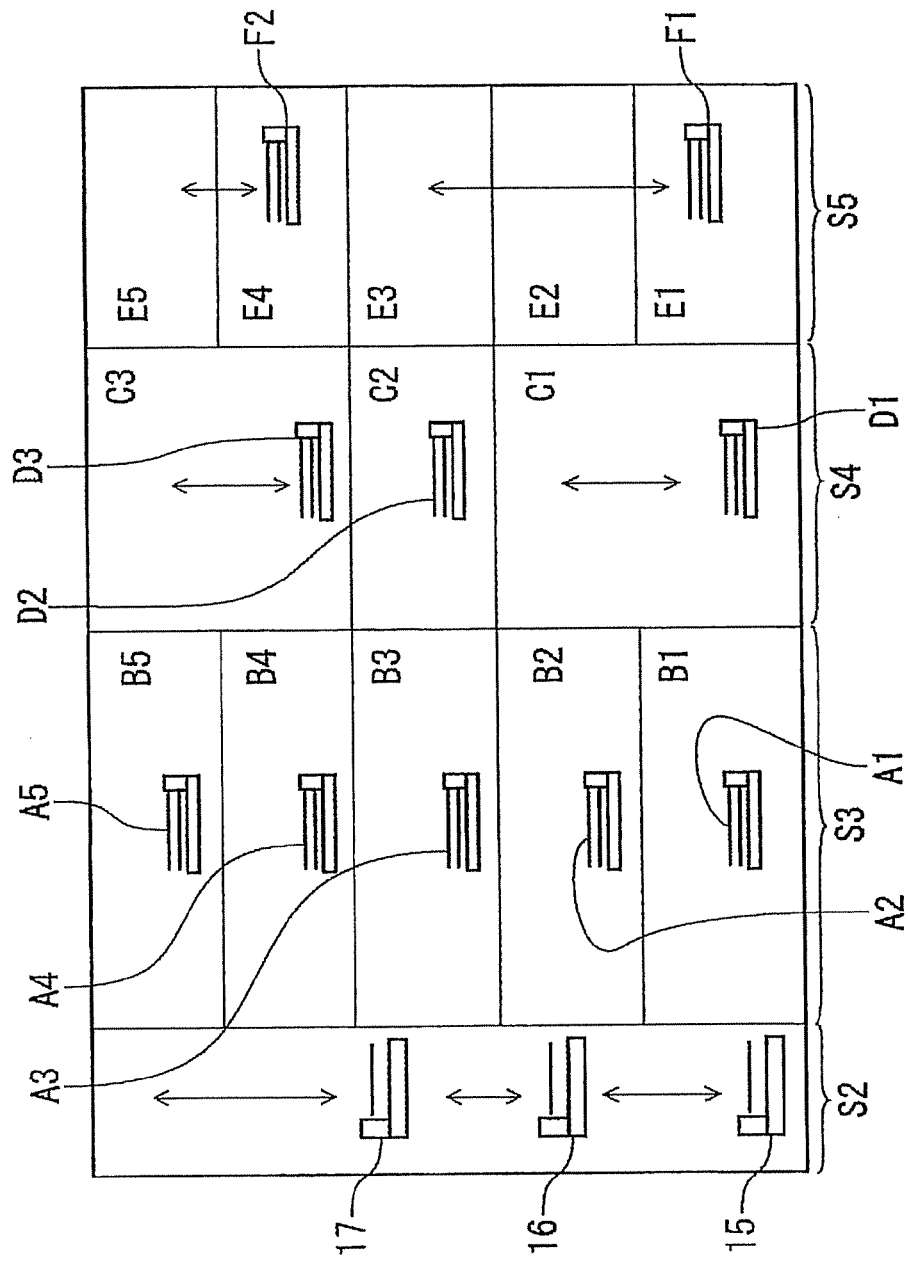
FIG. 4 is a schematic side view of the coating and developing apparatus.

Next, the front heating-process related block S2 will be explained. The front heating-process related block S2 is provided with shelf units U1 and U2 in which a plurality of modules are stacked. The shelf units U1 and U2 are arranged along a direction perpendicular to the direction from the carrier block S1 to the interface block S6. Delivery arms 15, 16 and 17, which are up and down transfer mechanisms, are disposed between the shelf units U1 and U2. FIG. 4 is a schematic view showing the positions of the transfer mechanisms for wafer W in the respective blocks. As shown in FIG. 4, the delivery arms 15, 16 and 17 are disposed in the up and down direction.

The structure of the shelf unit U1 is described below. Hydrophobing process modules ADH are arranged in multiple levels at the same height position as the position of the first liquid-process unit block B1. A number of heating modules are stacked at height positions corresponding to the positions of the second to fifth liquid-process unit blocks B2 to B5. The heating modules disposed at the height positions corresponding to the positions of the second and third liquid-process unit blocks B2 and B3 are shown as PAB, and the heating modules disposed at the height positions corresponding to the positions of the fourth and fifth liquid-process unit blocks B4 and B5 are shown as POST, respectively. The delivery module BU11 is disposed between the group of the heating modules PAB and the group of the hydrophobing process modules ADH. In addition, the delivery module BU12 is disposed between the group of the heating modules PAB and the group of the heating modules POST. The delivery modules BU11 and BU12 are arranged at height positions to which the delivery arm 13 is accessible.

The respective modules are described below. The hydrophobing process module ADH is a process module that heats the wafer W and supplies a process gas onto a surface of the wafer W including a bevel portion (peripheral portion). The hydrophobing process module ADH has a function for improving a hydrophobicity of the surface, and restraining peeling of respective films from the peripheral portion upon an immersion exposure process. The heating module PAB is adapted to heat the wafer W on which a resist film has been formed. The heating module POST is adapted to heat the developed wafer W. These heating modules PAB and POST and the below-described heating modules CHP and PEB have the same configuration, each having a heating plate 16 for heating the wafer W and a cooling plate 17. The cooling plate 17 is adapted to transfer the wafer W between the heating plate 16 and the transfer arm or a main arm, and to cool the heated wafer W.

The delivery module BU11 is a module to which the wafer W is delivered from the carrier C, and the delivery module BU12 is a module from which the wafer W is returned to the carrier C. In order that the wafers W transferred from the aforementioned delivery arm 13 as a batch, the delivery module BU11 has five stages on which the wafers W can be placed, the stages being arranged in the up and down direction. The wafers W transferred to the delivery module BU11 are taken out one by one from the delivery module BU11, and subjected to a process. The delivery module has a stage on which the wafer W can be placed. The delivery module described as BU has stages on which the plurality of wafers W can be placed, and can hold the wafers W placed thereon.

The shelf unit U2 is structured similarly to the shelf unit U1, but does not include the delivery modules BU11 and BU12. An inspection module, not shown, is provided on the shelf unit U2 at a height position corresponding to the position of the delivery module BU12. The inspection module is adapted to inspect, for example, whether a line width of a resist pattern is appropriate or not, and whether there is a foreign matter or not on the surface of the wafer W.

The delivery arms 15 to 17 are configured to be movable upward and downward, rotatable about the vertical axis, and movable forward and rearward. The delivery arm 15 is adapted to transfer the wafer W among the delivery module BU11, the hydrophobing process modules ADH and the below-described delivery module CPL11. The delivery arm 16 is adapted to transfer the wafer W among the heating modules PAB and the below-described delivery modules CPL12 and CPL13. The delivery arm 17 is adapted to transfer the wafer W among the heating modules POST, the below-described delivery modules CPL15 and CPL14, the delivery module BU12, and the inspection module.

Next, the liquid process block B3 will be explained in more detail. The liquid-process unit blocks B1 to B5 constituting the liquid process block S3 are structured to have the same layout in plan view. FIG. 3 shows the second liquid-process unit block B2 that is a unit block for a resist film. Herebelow, the second liquid-process unit block B2 is described as a representative of these liquid-process unit blocks. When it is supposed that the side of the carrier block S1 is a front side and that the side of the interface block S6 is a rear side, formed in the center of the second liquid-process unit block B2 is a transfer area R1 which is a linear transfer path extending in the back and forth direction. On the right and left sides of the transfer area R1, the resist-film forming modules COT1 and COT2 are disposed oppositely to each other.

Figure 5:
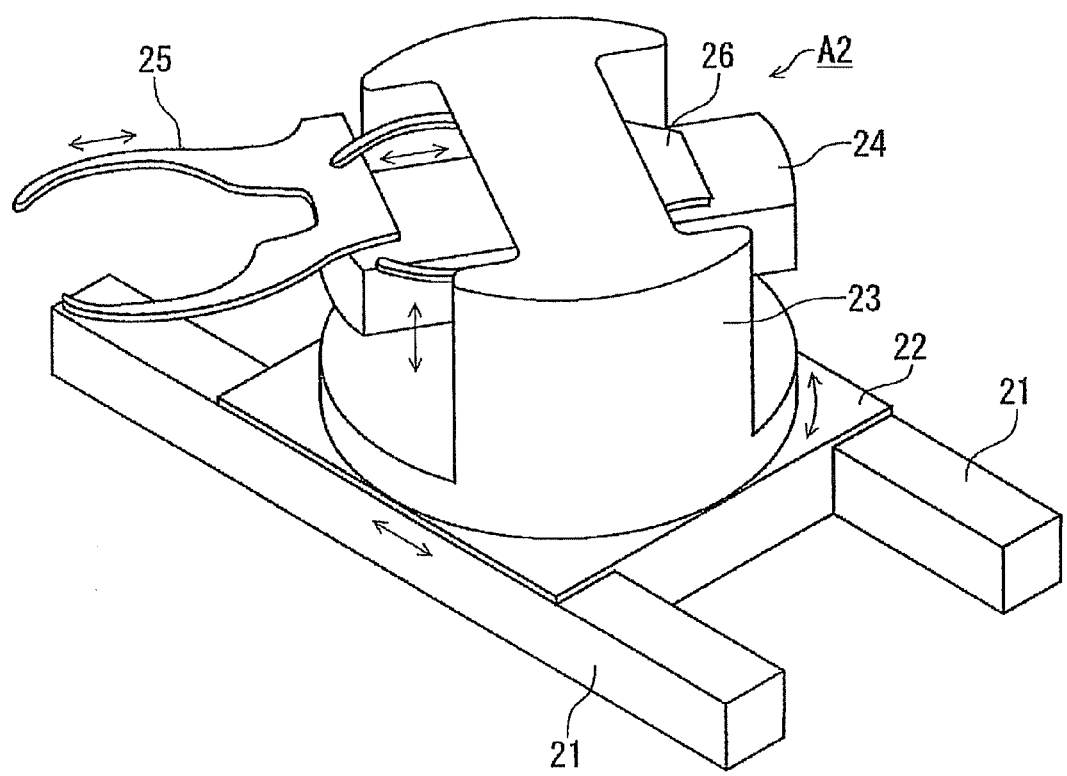
FIG. 5 is a perspective view of a main arm disposed on the coating and developing apparatus.

The transfer area R1 is provided with a main arm (main transfer mechanism) A2. FIG. 5 shows a perspective view of the main arm A2. The main arm A2 includes: guide rails 21 extending in the transfer area R1 in the back and forth direction; a horizontal moving table 22 adapted to move along the guide rails 21; a frame 23 disposed on the horizontal moving table 22 so as to be rotatable about the vertical axis; a base table 24; and wafer holders 25 and 26. The base table 24 is supported on the frame 23 so as to be movable upward and downward. The wafer holders 25 and 26 are supported on the base table 24 so as to be movable forward and rearward from the base table 24 independently of each other. Due to such a structure, the main arm A2 can transfer the wafer W among the respective modules of the second liquid-process unit block B2.

Figure 6:
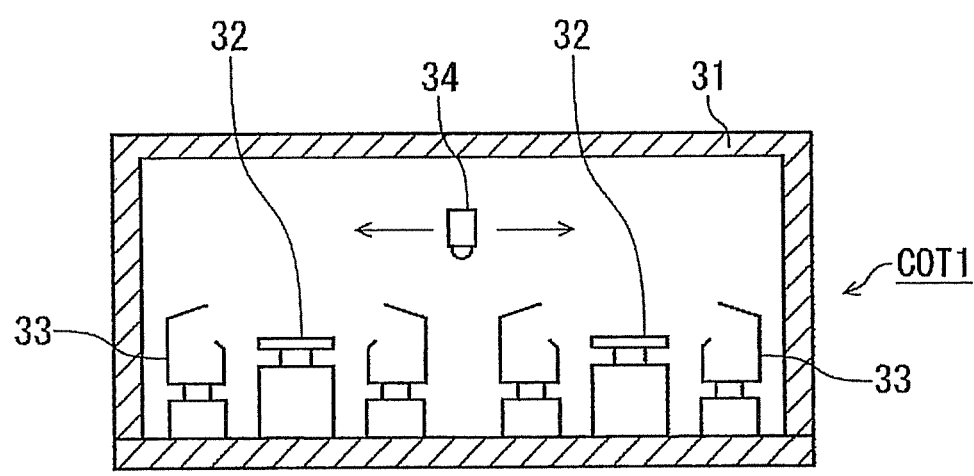
FIG. 6 is a side view of a liquid process module.

The resist-film forming module COT1 will be explained with reference also to FIG. 6 as a longitudinal sectional view thereof. The resist-film forming module COT1 includes a housing 31. In the housing 31, two spin chucks 32 are arranged along the transfer area R1. Each of the spin chucks 32 is adapted to absorb and hold a central portion of the rear surface of the wafer W, and is configured to be rotatable about the vertical axis. In FIG. 6, the reference number 33 depicts a process cup having an upper opening. The process cup 33 surrounds the periphery of the spin chuck 32 so as to restrain scattering of a resist. When the wafer W is processed, the wafer W is accommodated in the process cup 33, with the central portion of the rear surface of the wafer W being held by the spin chuck 32.

In addition, the resist-film forming module COT1 is provided with a nozzle 34 for common use in the respective process cups 33. In the drawings, the reference number 35 depicts a drive mechanism. The drive mechanism 35 is adapted to move the nozzle 34 through an arm 36 in the arrangement direction of the process cups 33, and to move the nozzle 34 upward and downward through the arm 36. The nozzle 34 is moved by the drive mechanism 35 between the process cups 33, and discharges a resist liquid onto the center of the wafer W which has been delivered to each spin chuck 32. The discharged resist liquid is extended to the peripheral edge of the wafer W by a centrifugal force of the wafer W that is rotated about the vertical axis by the spin chuck 32, so that a resist film is deposited on the wafer W. Although not shown, the resist-film forming module COT1 has a nozzle for supplying a solvent onto the peripheral part of the wafer W so as to remove an unnecessary film on the peripheral part. The resist-film forming module COT2 has the same configuration as that of the resist-film forming module COT1.

The respective liquid-process unit blocks B1 and B3 to B5 are briefly described. As shown in FIG. 4, the liquid-process unit blocks B1 and B3 to B5 are respectively provided with main arms A1 and A3 to A5 corresponding to the main arm A2. The respective main arms A1 to A5 are adapted to transfer the wafers W independently of each other.

Instead of the resist-film forming modules COT1 and COT2, the first liquid-process unit block B1 that is a unit block for an antireflection film is provided with antireflection-film forming modules BCT1 and BCT2 as the modules corresponding to the resist-film forming modules COT1 and COT2. Instead of the resist-film forming modules COT1 and COT2, the third liquid-process unit block B3 that is a unit block for an upper layer film is provided with protective-film forming modules TCT1 and TCT2. The fourth liquid-process unit block B4 that is a unit block for developing is provided with developing modules DEV1 and DEV2, and the fifth liquid-process unit block B5 that is a unit block for developing is provided with developing modules DEV3 and DEV4. Similarly to the modules COT1 and COT2, these liquid process modules are opposedly disposed on the right and left sides of the transfer area R1. These liquid process modules BCT, TCT and DEV are formed similarly to the resist-film forming module COT, excluding that a chemical liquid supplied from each nozzle 34 is not a resist liquid. Namely, the antireflection-film forming module BCT is adapted to supply a chemical liquid for forming an antireflection film from the nozzle 34 to the wafer W, the protective-film forming module TCT is adapted to supply a chemical liquid for forming a protective film from the nozzle 34 to the wafer W, and the developing module is adapted to supply a developing liquid from the nozzle 34 to the wafer W.

As shown in FIGS. 2 and 3, in the liquid process block S3, there is disposed a shelf unit U3 bridging the liquid-process unit blocks B1 to B5, on the side of the carrier block S1. The shelf unit U3 is composed of a number of modules stacked on one another, i.e., delivery modules CPL11 to CPL15 disposed at height positions to which the main arms A1 to A5 are accessible. The wafer W is transferred between the liquid process block S3 and the front heating-process related block S2 via these delivery modules of the shelf unit U3. The delivery module described as CPL has a cooling stage for cooing the wafer W placed thereon. The below-described delivery module TRS has a stage on which the wafer W can be placed.

As shown in FIG. 2, in the liquid process block S3, there is disposed a shelf unit U4 bridging the first to fifth liquid-process unit blocks B1 to B5, on the side of the interface block S6. The shelf unit U4 is composed of a plurality of modules stacked on one another, i.e., the delivery modules TRS11 to TRS15 disposed at height positions corresponding to those of the first to fifth liquid-process unit blocks B1 to B5. The wafer W is transferred between the liquid process block S3 and the rear heating block S4 via these delivery modules TRS of the shelf unit U4.

Next, the rear heating block S4 will be explained. The first to third heating-process unit blocks C1 to C3 constituting the rear heating block S4 respectively include heating modules, main arms D1 to D3 which are up and down transfer mechanisms serving as transfer means for the unit blocks, and transfer area R2 for wafer W. The first to third heating-process unit blocks C1 to C3 have substantially the same configuration. Herein, the first heating-process unit block C1 shown in FIG. 3 is described as a representative of these heating-process unit blocks. The transfer area R2 extending in the back and forth direction is formed in the center of the first heating-process unit block C1. Shelf units U11 to U14 are arranged along the transfer area R2. The shelf units U11 and U13 are oppositely disposed on the right and left sides of the transfer area R2, and the shelf units U12 and U14 are oppositely disposed on the right and left sides of the transfer area R2.

Each of the respective shelf units U11 to U14 includes a plurality of heating modules, e.g., five heating modules stacked on one another. As described above, these heating modules are modules for heating the wafer W on which an antireflection film has been formed. These heating modules are shown as CHP in the drawings. In addition, the transfer area R2 is provided with the main arm D1. The main arm D1 has the same configuration as that of the main arm A of the liquid process block S3. Namely, the main arm D1 is configured to be movable rightward and leftward, movable upward and downward, rotatable about the vertical axis, and movable forward and rearward.

The other heating-process unit blocks C are briefly described. The second heating-process unit block C2 is structured similarly to the first heating-process unit block C1, excluding the number of the stacked heating modules. The heating modules CHP disposed in the heating-process unit block C2 are modules for heating the wafer W on which a protective film has been formed. The third heating-process unit block C3 is also structured similarly to the first heating-process unit block C1, excluding the number of the stacked heating modules. The heating modules PEB disposed in the heating-process unit block C3 are modules for heating the wafer W which has been subjected to an exposure process but is not yet subjected to a developing process. As shown in FIG. 4, the liquid-process unit block C2 and C3 are respectively provided with the main arms D2 and D3 corresponding to the main arm D1. The respective main arms D1 to D3 are adapted to transfer the wafers W independently of each other.

Next, the cleaning block S5 will be explained. The cleaning block S5 is structured by stacking upward first to fifth cleaning unit blocks E1 to E5, in this order. The respective cleaning unit blocks E1 to E5 are separated from each other by partition walls. The first and second cleaning unit blocks E1 and E2 are adjacent to the heating-process unit block C1. The third cleaning unit block E3 is adjacent to the second heating-process unit block C2, and the fourth and fifth cleaning unit blocks E4 and E5 are adjacent to the heating-process unit blocks C3 and C4, respectively.

The first to fifth cleaning unit blocks E1 to E5 have substantially the same configuration. The second cleaning unit block E2 shown in FIG. 2 is described as a representative of these cleaning unit blocks. A transfer area R3 for wafer W is formed in the center of the second cleaning unit block E2. The transfer area R3 is provided with a main arm F1. On the right and left sides of the transfer area R3, rear-surface cleaning modules BST3 and BST4 are disposed oppositely to each other. Each of the rear-surface cleaning modules BST is structured similarly to the antireflection-film forming module BCT, but is different therefrom in that the rear-surface cleaning module BST has the one process cup 33 and the one spin chuck 32. In addition, differently from the antireflection film forming module BCT, there is provided, instead of the nozzle 34, a nozzle, not shown, for supplying a cleaning liquid onto the rear surface and the bevel portion of the wafer W so as to clean the same, for each process cup 33.

The first cleaning unit block E1 is provided with rear-surface cleaning modules BST1 and BST2 corresponding to the rear-surface cleaning modules BST3 and BST4, respectively. The third cleaning unit block E3 is provided with rear-surface cleaning modules BST5 and BST6 corresponding to the rear-surface cleaning modules BST3 and BST4, respectively. The transfer areas R3 of the first to third cleaning unit blocks E1 to E3 are communicated with each other. The first to third cleaning unit blocks E1 to E3 share the main arm F1. Namely, the main arm F1 is configured to be movable upward and downward to the respective height positions of the first to third cleaning unit blocks E1 to E3. The main arm F1 is structured similarly to the main arm A, excluding that the guide rails 21 are not disposed. Namely, the main arm F1 is configured to be movable rightward and leftward, movable upward and downward, rotatable about the vertical axis, and movable forward and rearward. The aforementioned delivery arms 15 to 17 are structured similarly to the main arm F1.

The fourth cleaning unit block E4 is provided with post-exposure cleaning modules PIR1 and PIR2, instead of the rear-surface cleaning modules BST3 and BST4. Each of the post-exposure cleaning modules PIR1 and PIR2 is a module for supplying the wafer W with a process liquid for removing a protective film or a cleaning liquid, and is structured similarly to the resist-film forming module COT. However, differently therefrom, each of the post-exposure cleaning modules PIR1 and PIR2 has one process cup 23 and one spin chuck 22. One nozzle 24 is disposed for the process cup 23 and the spin chuck 22.

The fifth cleaning unit block E5 is provided with post-exposure cleaning modules PIR3 and PIR4 corresponding to the post-exposure cleaning modules PIR1 and PIR2, respectively. The fourth and fifth cleaning unit blocks E4 and E5 share a main arm F2 corresponding to the main arm F1. The main arm F2 is adapted to be moved upward and downward to the respective height positions of the fourth and fifth cleaning unit blocks E4 and E5.

As shown in FIGS. 2 and 3, on the side of the carrier block S1 of the transfer areas R3 in the respective layers, there is disposed a shelf unit U5 bridging the first to fifth cleaning unit blocks E1 to E5. In the shelf unit U5, there are provided a delivery module CPL31 located on a position to which the main arm F1 and the main arm D2 are accessible, and a delivery module CPL32 located on a position to which the main arm F2 and the main arm D3 are accessible. In addition, there is provided a delivery module CPL33 located on a position to which the main arm F2 and the main arm D4 are accessible.

Figure 7:
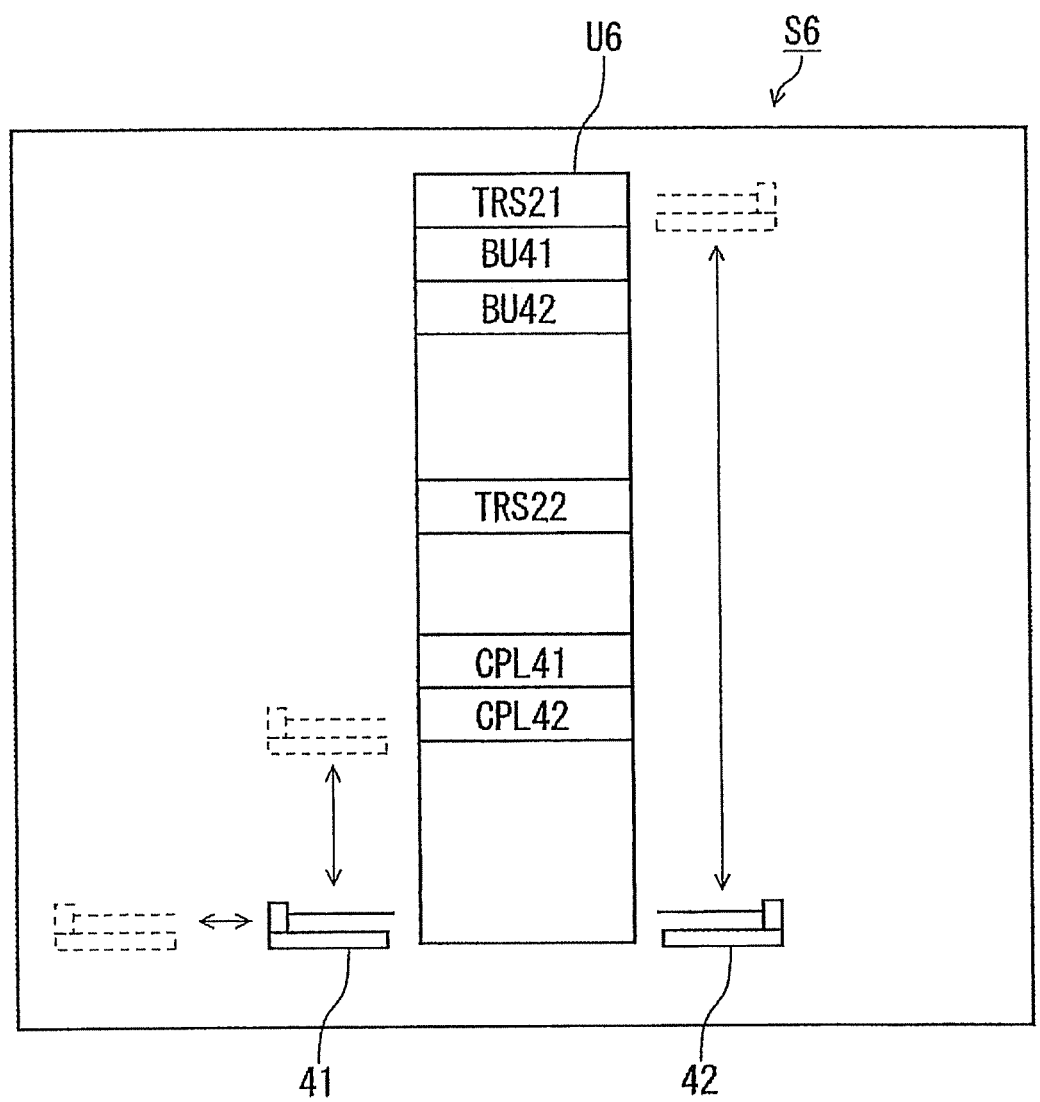
FIG. 7 is a longitudinal sectional front view of an interface block constituting the coating and developing apparatus.

Next, the interface block S6 will be explained with reference also to FIG. 7 as a longitudinal sectional view thereof. The interface block S6 is provided with a shelf unit U6 composed of a plurality of stacked modules. In the shelf unit U6, a delivery module TRS 21 is disposed on a height position to which the main arm F2 is accessible, and a delivery module TRS22 is disposed on a height position to which the main arm F1 is accessible. In addition, the shelf unit U6 is provided with delivery modules BU41, BU42, CPL41 and CPL42.

In addition, the interface block S6 includes interface arms 41 and 42. The interface arms 41 and 42 are configured to be rotatable, movable upward and downward, and movable rightward and leftward. Further, the interface arm 41 is configured to be horizontally movable. The interface arm 41 is adapted to access the exposure apparatus S7 and the delivery modules CPL41 and CPL42, so as to transfer the wafer W thereamong. The interface arm 42 is adapted to access the respective modules constituting the shelf unit U6, so as to transfer the wafer W thereamong.

Next, a control unit 51 disposed on the coating and developing apparatus 1 will be explained. The control unit 51 includes a program, a memory and a CPU. The program incorporates commands (respective steps) by which control signals are transmitted from the control unit 51 to the respective modules and the transfer means of wafer W in the coating and developing apparatus 1 so as to achieve the below-described transfer operation of the wafer W and various processes thereof. The program (including a program relating to input operations of process parameters and display thereof) is stored in a non-transitory tangible medium, such as a flexible disc, a compact disc, a hard disc, an MO (magneto optic disc) or a memory card, and is installed in the control unit 51. The memory stores a transfer schedule in which an ID of each wafer W in the carrier C and the module to which the wafer W is transferred are related to each other.

With reference to FIG. 2, the transfer route of the wafer W through each unit in the coating and developing apparatus 1 is explained in detail. The wafer W, which has been delivered by the delivery arm 13 from the carrier C to the delivery module BU11 of the shelf unit U1, is transferred to the delivery arm 15 and to the hydrophobing process modules ADH of one of the shelf units U1 and U2, in this order. Then, the wafer W is subjected to the hydrophobing process. After the hydrophobing process, the wafer W is transferred to the delivery arm 15, the delivery module CPL11 of the shelf unit U3, the main arm A1 of the first liquid-process unit block B1, and the antireflection-film forming module BCT1 or BCT2, in this order. Then, an antireflection film is formed on the wafer W.

The wafer W on which the antireflection film has been formed is transferred to the main arm A1, the delivery module TRS11 of the shelf unit U4, the main arm D1 of the first heating-process unit block C1, the heating module CPH, the main arm D1, the delivery module TRS12 of the shelf unit U4, the main arm A2 of the second liquid-process unit block B2, and the resist-film forming module COT1 or COT2, in this order. Then, a resist film is formed on the wafer W.

Following thereto, the wafer W is transferred to the main arm A2, the delivery module. CPL12 of the shelf unit U3, the delivery arm 16, the heating module PAB, the delivery arm 16, the delivery module CPL13 of the shelf unit U3, the main arm A3 of the third liquid-process unit block B3, and the protective-film forming module TCT1 or TCT2, in this order. Then, a protective film is formed as an upper layer on the resist film.

Then, the wafer W is transferred to the main arm A3, the delivery module TRS13 of the shelf unit U4, the main arm D2 of the second heating-process unit block C2, the heating module CHP, the main arm D2, the delivery module CPL31 of the shelf unit U5, the main arm F1 of the first to third cleaning unit blocks E1 to E3, and one of the rear-surface cleaning modules BST1 to BST6, in this order. Then, the wafer W is subjected to the rear-surface cleaning process. After the rear-surface cleaning process, the wafer W is transferred to the main arm F1, the transfer module TRS22 of the shelf unit U6, the interface arm 42, the delivery module BU41, the interface arm 42, the delivery module CPL41, the interface arm 41, and the exposure apparatus S7, in this order. Then, the wafer W is subjected to the immersion exposure process.

After the immersion exposure process, the wafer W is transferred to the interface arm 41, the delivery module CPL42, the interface arm 42, the delivery module BU42, the interface arm 42, the delivery module TRS21, the main arm F2 of the fourth and fifth cleaning unit blocks E4 and E5, and one of the post-exposure cleaning modules PIR1 to PIR4 of the fourth or fifth cleaning unit block E4 or E5. Then, the wafer W is subjected to the protective-film removal process and the cleaning process.

Thereafter, the wafer W is transferred to the main arm F2, the delivery module CPL32 or CPL33 of the shelf unit U5, the main arm D3 of the third heating-process unit block C3, the heating module PEB, the main arm D3, and the delivery module TRS14 or TRS15 of the shelf unit U4. The wafer W, which has been transferred to the delivery module TRS14, is transferred to the main arm A4 of the fourth liquid-process unit block B4, and the developing module DEV1 or DEV2, in this order. After having been subjected to the developing process, the wafer W is transferred by the main arm A4 to the delivery module CPL14 of the shelf unit U3. On the other hand, the wafer W, which has been transferred to the delivery module TRS15, is transferred to the main arm A5 of the fifth liquid-process unit block B5, and the developing module DEV3 or DV4. After having been subjected to the developing process, the wafer W is transferred by the main arm A5 to the delivery module CPL15 of the shelf unit U3.

The wafer W, which has been transferred to one of the delivery modules CPL14 and CPL15, is transferred to the delivery arm 17, the heating module POST of the shelf unit U1 or U2, the delivery arm 17, and the inspection module of the shelf unit U2. Then, the wafer W is subjected to the inspection process. After the inspection process, the wafer W is transferred to the delivery arm 17, the delivery module BU12 of the shelf unit U1, and the delivery arm 13, in this order. Then, the delivery arm 13 returns the wafer W to the carrier C.

Figure 8:
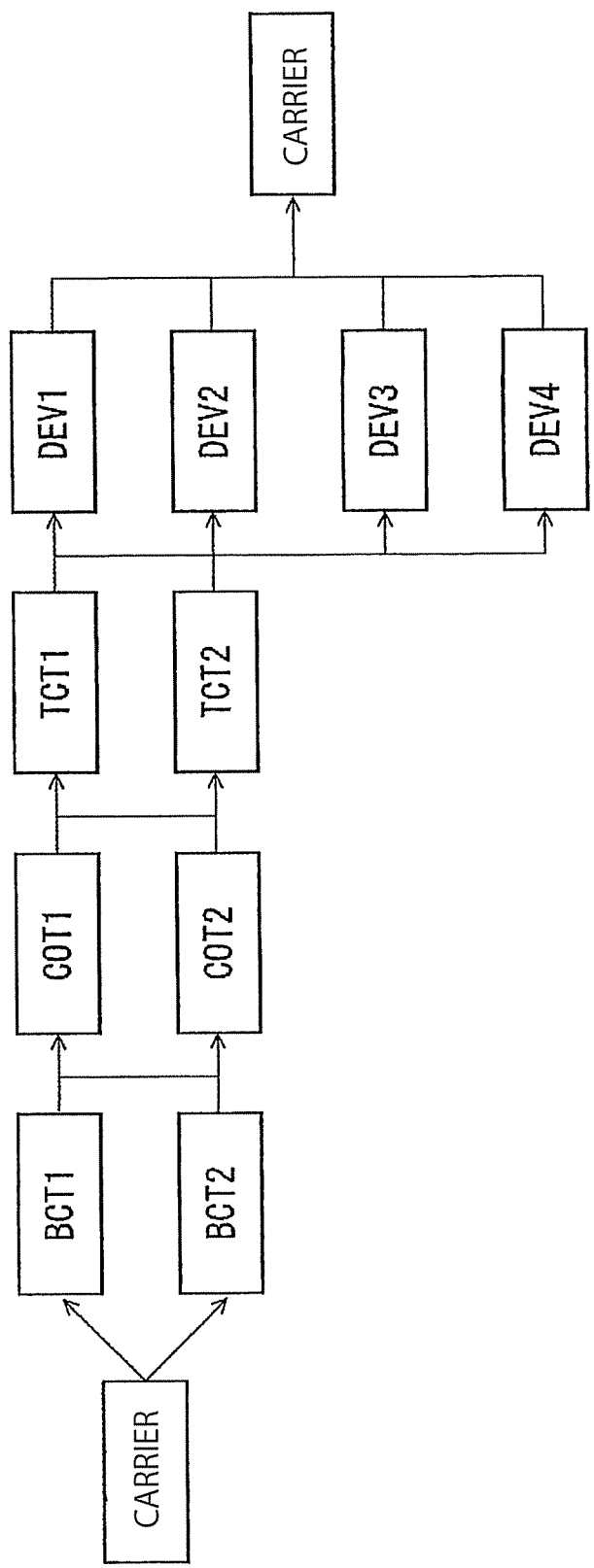
FIG. 8 is a flowchart of a transfer route of a wafer.
Figure 9:
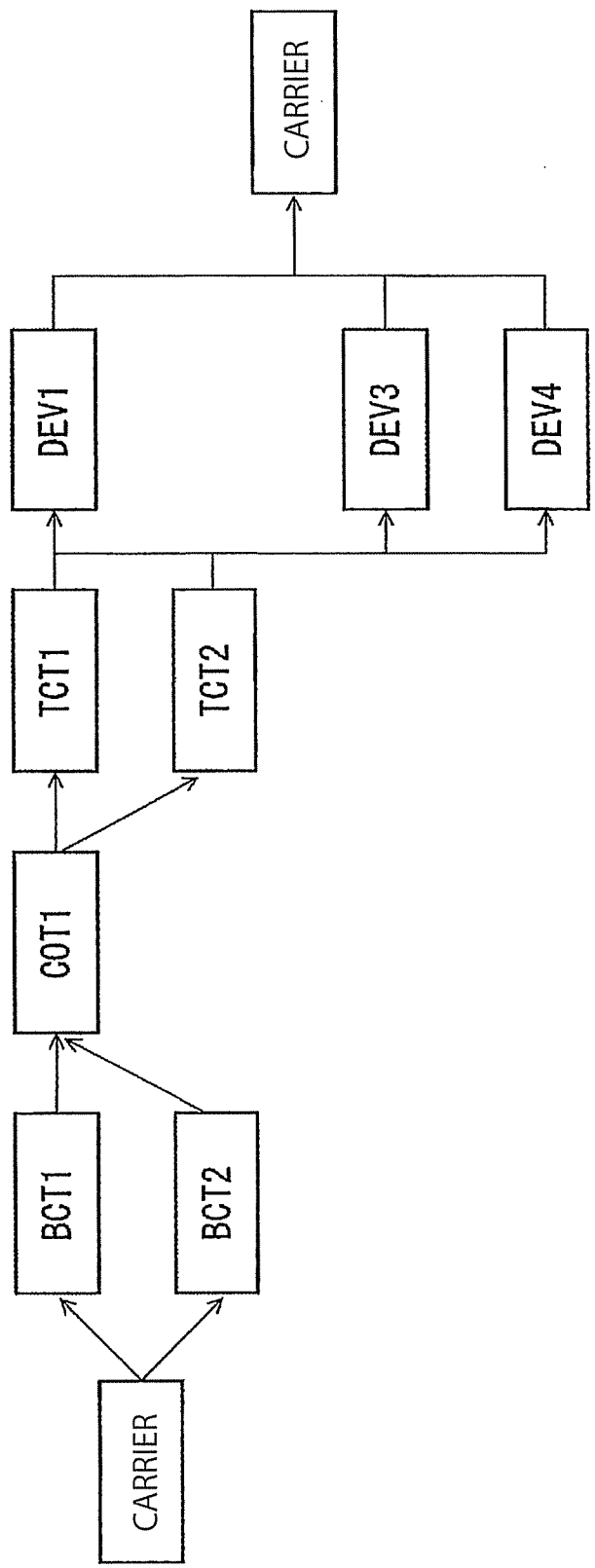
FIG. 9 is a flowchart of the transfer route of the wafer.

In the course of transferring or processing the wafer W, when one of the liquid process modules in the respective layers of the liquid process block S3 becomes unavailable, the transfer schedule is changed such that a succeeding wafer W is transferred to the other liquid process module opposed to the unavailable liquid process module. FIG. 8 schematically shows the transfer route of the wafer W in the aforementioned general transfer operation. FIG. 9 schematically shows a transfer route in which the resist-film forming module COT2 and the developing module DEV2 become unavailable, for example.

As shown by the flowchart of FIG. 9, when the resist-film forming module COT2 becomes unavailable, the transfer schedule is changed such that the wafer W, which has been programmed to be loaded into the resist-film forming module COT2, is transferred to the resist-film forming module COT1 and is processed therein. In addition, the transfer schedule is changed such that the wafer W, which has been programmed to be loaded into the developing module DEV2, is transferred to the developing module DEV1 and is processed therein. Similarly, when one of the modules TCT and/or one of the modules BCT become unavailable, the wafer W is transferred to the opposed liquid process module of the same kind. The case in which the liquid process module is unavailable is that the module is out of order or that the module is under maintenance. When the module is out of order, the control unit 51 automatically changes the transfer schedule in the above manner. When the module is under maintenance, a user sets the liquid process module that is maintained, and the control unit 51 changes the transfer schedule in the above manner.

The process block S20 constituting the coating and developing apparatus 1 is formed by arranging the front heating-process related block S2, the liquid process block S4, and the rear heating block S3, in this order from the side of the carrier block S1 to the side of the interface block S6. The liquid process block S3 is formed by stacking the unit block B1 for forming an antireflection film, the unit block B2 for forming a resist film, the unit block B3 for forming a protective film, and the unit blocks B4 and 65 for developing. The liquid process modules of each of the unit blocks B1 to 65 are located on the right and left sides of the transfer area R1 of a wafer W extending from the carrier block S1 toward the interface block S6. By locating the respective blocks and the respective unit blocks in this manner, the installation area of the coating and developing apparatus 1 can be reduced. In addition, when one of the two liquid process modules of the same kind disposed in the respective first to fifth liquid-process unit blocks B1 to 65 is unavailable, the wafer W can be processed in the other module. Thus, the wafer W can be transferred to a downstream module succeeding the unavailable module. Thus, lowering of process efficiency can be restrained.

In addition, in the rear heating block S4, there are separately disposed the main arm D1, which is adapted to transfer the wafer W from the delivery module TRS11 of the first liquid-process unit block B1 to the delivery module TRS12 of the second liquid-process unit block 62, and the main arm D2, which is adapted to transfer the wafer W from the delivery module TRS13 of the third liquid-process unit block B3 to the cleaning block S5. Thus, the wafer W can be rapidly transferred between the liquid-process unit blocks B1 and B2, and between the liquid-process unit block B3 and the cleaning block S5, whereby a process efficiency can be improved. Note that, in this embodiment and another embodiment, a film to be formed on the resist film as an upper layer film by the third liquid-process unit block B3 is not limited to a protective film, but may be an antireflection film to be formed on the resist as an upper layer film.

(Second Embodiment)

Figure 10:
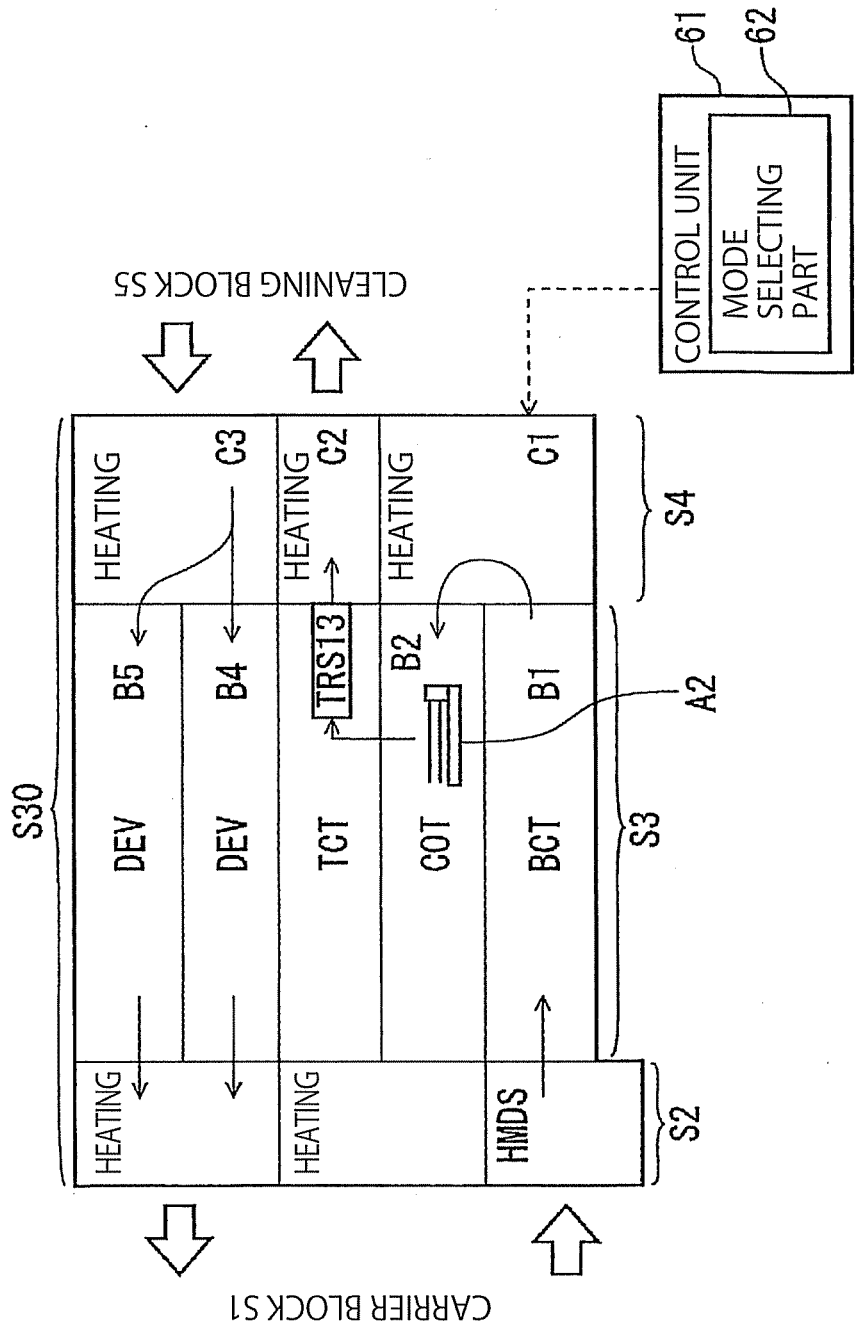
FIG. 10 is a side view showing another structure example of the process block.

Next, a second embodiment of the coating and developing apparatus 1 will be explained with reference to FIG. 10, focusing on differences of the second embodiment from the first embodiment. A transfer area R1 of a second liquid-process unit block B2 of the process block S30 in FIG. 10 and a transfer area R1 of a third liquid-process unit block B3 thereof are not separated from each other, but are opened to each other. A main arm A2 is shared by the second liquid-process unit block B2 and the third liquid-process unit block B3, such that the main arm A2 can be moved upward and downward between the second liquid-process unit block B2 and the third liquid-process unit block B3. Excluding these configurations, the process block S30 is structured similarly to the aforementioned process block S20.

Differently from the control unit 51, a control unit 61 of the coating and developing apparatus 1 has a mode selecting part 62. The mode selecting part 62 is composed of a mouse, a keyboard or a touch panel and the like, whereby a user can select one of a wafer transfer mode 1 and a wafer transfer mode 2. When the transfer mode 1 is selected, a wafer W is transferred in the same manner as the first embodiment. Namely, an antireflection film, a resist film and a protective film are formed on the wafer W in this order, and thereafter the wafer W is subjected to the developing process. However, since the main arm A3 is not provided in the coating and developing apparatus 1 in this embodiment, the transfer operation performed by the main arm A3 in the first embodiment is performed by the main arm A2 in place of the main arm A3.

On the other hand, when the transfer mode 2 is selected, the wafer W on which a resist film has been formed is transferred to a cleaning block S5, without a protective film being formed on the wafer W. The arrows in FIG. 10 show the flow of the wafer W when the transfer mode 2 is executed. To be more specific, the wafer W is transferred to the resist-film forming module COT1 or COT 2 along the same route as that of the first embodiment. After a resist film has been formed in the resist-film forming module COT1 or COT2, the wafer W is delivered to the main arm A2. The main arm A2 transfers the wafer W to a delivery module TRS13 located on a height position corresponding to the position of the third liquid-process unit block B3. The wafer W on the delivery module TRS13 is transferred by the main arm D2 of the second heating-process unit block C2, to a heating module CHP. After the wafer W has been heated in the heating module CHP, the wafer W is transferred to the cleaning block S5. Subsequently, the wafer W is transferred along the same transfer route as that of the first embodiment.

Also in this second embodiment, similarly to the first embodiment, the installation area of the coating and developing apparatus can be reduced, and lowering of process efficiency can be restrained. In addition, when a protective film is not formed, the wafer W is loaded from the second liquid-process unit block B2 to the rear heating process block S4, without being returned to the front heating-process related block S2. Thus, a throughput can be further improved.

(Third Embodiment)

Figure 11:
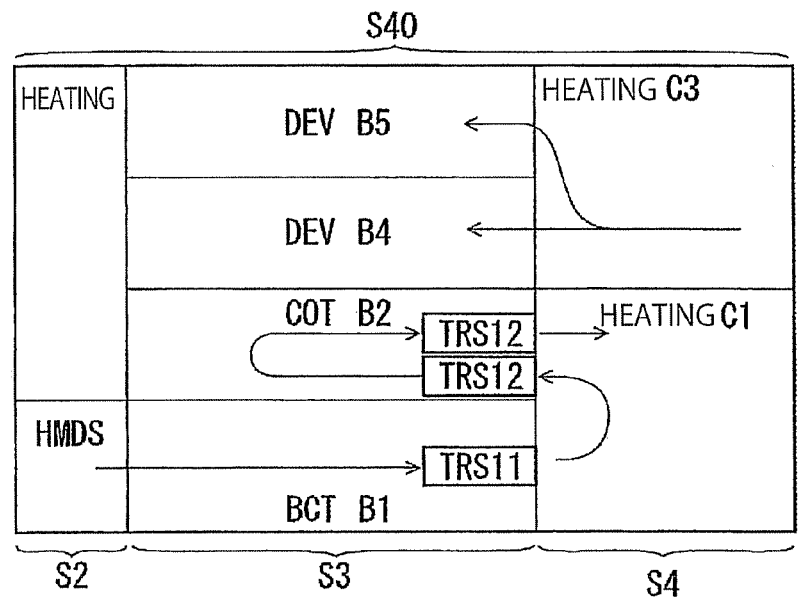
FIG. 11 is a side view showing another structural example of the process block.

As shown in FIG. 11, a process block S40 provided in a third embodiment of the coating and developing apparatus 1 does not include the liquid-process unit block B3 and the heating-process unit block C2. Excluding this difference, the process block S40 is structured similarly to the process block S20 in the first embodiment. Similarly to the route of the first embodiment, a wafer W is transferred to an antireflection-film forming module, a delivery module TRS11, a heating module CHP, and a delivery module TRS12, in this order, and thereafter a resist film is formed on the wafer W in a resist-film forming module COT1 or COT2. Then, the wafer W is transferred to the delivery module TRS12 by a main arm A2, and is further delivered to a main arm D1 of a first heating-process unit block C1. After that, the wafer W is transferred to a heating module CHP, and is heated therein. Then, the wafer W is transferred to a cleaning block S5. Subsequently, the wafer W is transferred along the same transfer route as that of the first embodiment. Even when the process block has such a configuration, the same effects as those of the first embodiment can be obtained.

Figure 12:
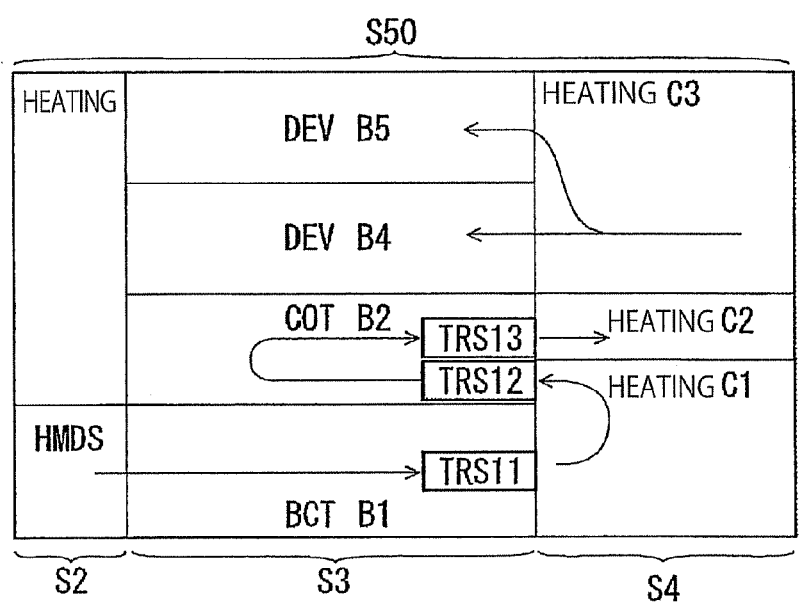
FIG. 12 is a side view showing further another structural example of the process block.

A process block S50 shown in FIG. 12 is a modification of the third embodiment. Similarly to the first embodiment, the process block S50 includes first to third heating-process unit blocks C1 to C3. However, differently from the first embodiment, the first heating-process unit block C1 is adjacent to a first liquid-process unit block B1 and a second liquid-process unit block B2 on a lower side thereof, and the second heating-process unit block C2 is adjacent to the second liquid-process unit block B2 on an upper side thereof. A delivery module TRS12 of a shelf unit U4 of a liquid process block S4 is located on a height position corresponding to the position of the first heating-process unit block C1, and a delivery module TRS13 thereof is located on a height position corresponding to the position of the second heating-process unit block C2.

In the process block S50, after an antireflection forming process, a wafer W is loaded into the delivery module TRS11, similarly to the other embodiments. Thereafter, the wafer W is loaded by a main arm D1 into a heating module CHP of the first heating-process unit block C1, and is subjected to a heating process therein. Then, the wafer W is transferred to the delivery module TRS12. After that, the wafer W, on which a resist film has been formed in the second liquid-process unit block B2, is transferred to the delivery module TRS13. Then, the wafer W is transferred by the main arm D2 of the second heating-process unit block C2, to a heating module CHP of the second heating-process unit block C2, and is subjected to a heating process therein. Thereafter, the wafer W is transferred by the main arm D2 to a cleaning block S5. Subsequently, the wafer W is transferred along the same transfer route as that of the first embodiment. Also in this embodiment, the same effects as those of the first embodiment can be obtained. In the respective embodiments, the main arm may be shared by the liquid-process unit blocks 34 and B5. Namely, the main arm A5 may be omitted, and the main arm A4 may be moved upward and downward between the liquid-process unit blocks B4 and 35 so as to transfer the wafer W to the respective modules located on height positions corresponding to the positions of the liquid-process unit blocks B4 and B5.

In the respective embodiment, although the unit block for developing is two-layered (the number of the unit blocks for developing is two), the unit block for developing may be three-layered or more. Alternatively, the unit block for developing may be single-layered. In addition, the unit blocks B4 and B5 for developing may share one main arm A, and this main arm may access the respective modules in the unit blocks B4 and B5. Even when the main arm A is shared, as long as the unit block B has a height twice that of another unit block B, such a unit block B can be regarded as two-layered.

Figure 13:
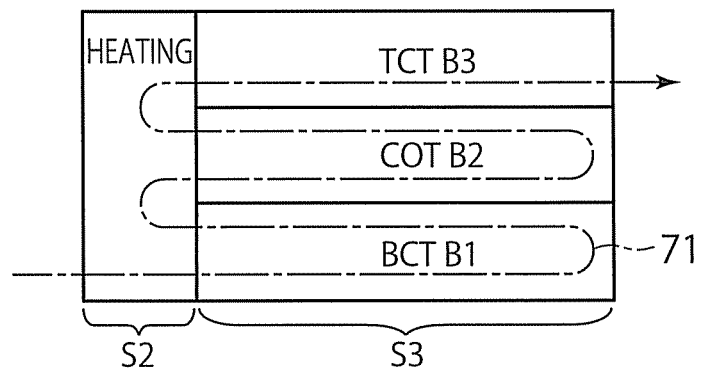
FIG. 13 is a side view schematically showing another structure of the process block.
Figure 14:
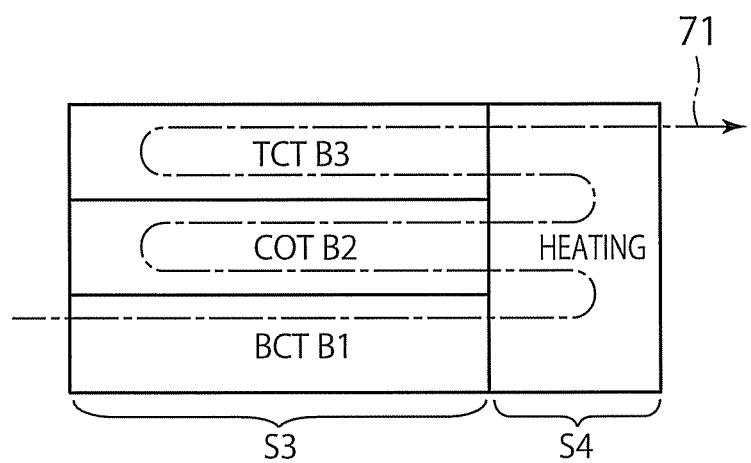
FIG. 14 is a side view schematically showing another structure of the process block.

Next, modifications of the present invention will be described below.
(1) The group of liquid-process related unit blocks are formed by stacking the unit block for an antireflection film, the unit block for a resist film, and the unit block for an upper layer film, in this order from below. However, not limited thereto, these unit blocks may be stacked in this order from above.
(2) In the embodiment shown in FIG. 1, the heating-process related blocks are divided to the block on the side of the carrier block S1 of the group of liquid-process related unit blocks, and the block on the side of the interface block S6 thereof. However, as shown in FIG. 13, the heating-process related block may be disposed only on the side of the carrier block S1 of the group of liquid-process related unit blocks. Alternatively, as shown in FIG. 14, the heating-process related block may be disposed only on the side of the interface block S6 of the group of liquid-process related unit blocks. In FIGS. 13 and 14, a chain line 71 depicts a flow of a wafer W.

The heating-process related block is formed by stacking the plurality of heating modules PAB and CHP for heating a coating film formed by each of the group of unit blocks for forming a coating film. However, when the heating-process related blocks are divided to the block on the side (front side) of the carrier block of the group of liquid-process related unit blocks and the block on the side (rear side) of the interface block S6 thereof, the heating modules PAB and CHP for heating the coating film are disposed on one of the front heating block S2 and the rear heating block S4.

The heating modules that perform a heating process to be performed before and after a developing process are stacked on one another, so as to constitute the heating-process related block. In this case, the heating module PEB for heating an exposed wafer W before being developed, and the heating module POST for heating a developed wafer W may be disposed all together on the side of the interface block S6 of the unit block for developing, or may be disposed all together on the side of the carrier block S1 of the unit block for developing. Therefore, the features of the present invention including the modifications are as follows.

a) In the process block, the heating-process related block is disposed on at least one of the side of the carrier block of the group of liquid-process related unit blocks, and the side of the interface block thereof.
b) The heating-process related block includes the plurality of heating modules stacked on one another in the up and down direction, and the up and down transfer mechanism capable of being moved upward and downward so as to transfer a substrate between these heating modules.
c) There are provided delivery stages disposed on each of the unit block for an antireflection film, the unit block for a resist film, and the unit block for an upper layer film, so as to transfer a substrate between the main transfer mechanism of each unit block and the up and down transfer mechanism.
d) The transfer operation of a substrate between the unit block for an antireflection film, the unit block for a resist film, and the unit block for an upper layer film is performed by the up and down transfer mechanism via the delivery stages described in the above item c).
e) Each of the heating modules is a module for heating a coating film coated on a substrate in each unit block of the group of unit blocks for forming a coating film.

Figure 15:
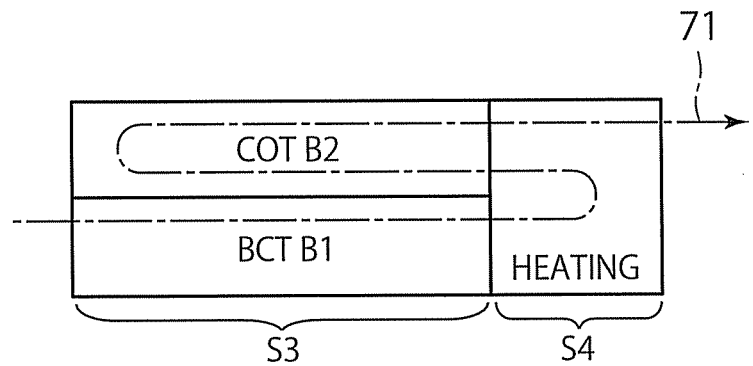
FIG. 15 is a side view schematically showing another structure of the process block.
Figure 16:
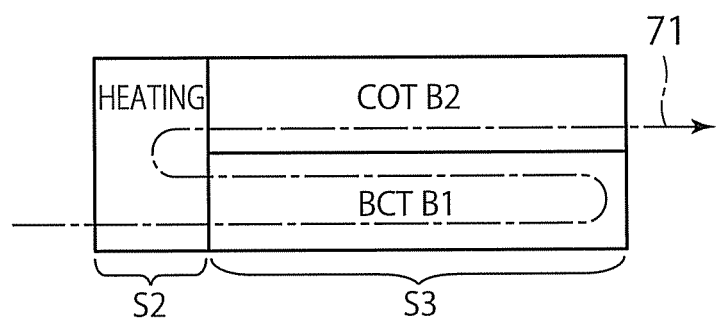
FIG. 16 is a side view schematically showing another structure of the process block.

When an upper layer film is not formed on a resist film of a wafer, the heating-process related block may be disposed on the rear side of a group (in this example, two unit blocks are referred to as "group") of unit blocks for coating films, including the unit block for an antireflection film and the unit block for a resist film, which is shown in FIG. 15, or may be disposed on the front side of the group of unit blocks for coating films, which is shown in FIG. 16. In this manner, by separating the group of unit blocks for coating films and the unit block for developing from the heating modules, by stacking the heating modules as the heating-process related block, and by arranging the heating-process related block on the side of the carrier block of the group of liquid-process related unit blocks or on the side of the interface block thereof, an apparatus compact in size can be manufactured. In particular, when seen from the side of the carrier block, the size of the apparatus in the back and forth direction can be decreased. In addition, since the transfer operation of a wafer between the unit blocks for coating films can be performed by using the up and down transfer mechanism of the heating-process related block, the transfer efficiency can be raised. Further, in terms of hardwares, the transfer members can be efficiently designed as a whole.

The invention claimed is:
1. A coating and developing apparatus comprising:
a carrier block;
a process block to which a substrate that has been loaded into the carrier block by a carrier is delivered, the process block being configured to form a coating film including a resist film on the substrate;
an interface block arranged on an opposed side of the carrier block with respect to the process block; and
an exposure apparatus configured to expose the substrate that has been transferred thereto from the process block via the interface block;
wherein:

the substrate that has been loaded into the carrier block by the carrier is delivered to the process block, a coating film including a resist film is formed on the substrate in the process block, the substrate is transferred to the exposure apparatus via the interface block, the exposed substrate, which has been returned to the process block via the interface block, is developed in the process block, and the developed substrate is delivered to the carrier block;

in the process block, a heating-process related block on the side of the carrier block, a group of liquid-process related unit blocks, and a heating block on the side of the interface block, are arranged in this order from the side of the carrier block to the side of the interface block;

the group of liquid-process related unit blocks are composed of:

a group of unit blocks for coating films that is formed by stacking upward a unit block for an antireflection film configured to form an antireflection film on a substrate, a unit block for a resist film configured to form a resist film on the antireflection film, and a unit block for an upper layer film configured to form an upper layer film on the resist film, in this order; and unit blocks for developing that are stacked on one another in the up and down direction with respect to the group of unit blocks for coating films, each unit block for developing being configured to develop an exposed substrate;

when a direction along which the interface block is seen from the carrier block is supposed to be seen from the front, each unit block of the group of unit blocks for coating films includes: a linear transfer path extending in the back and forth direction; liquid process modules arranged on the right and left sides of the linear transfer path, each liquid process module being configured to supply a substrate with a chemical liquid corresponding to each coating film; and a main transfer mechanism configured to be moved along the linear transfer path so as to transfer a substrate between these liquid process modules;

the unit block for developing includes: a linear transfer path extending in the back and forth direction; developing modules arranged on the right and left sides of the linear transfer path, each developing module being configured to supply a substrate with a developing liquid; and a main transfer mechanism configured to be moved along the linear transfer path so as to transfer a substrate between these developing modules;

in the heating-process related block on the side of the carrier block, there are provided: a number of heating modules that are stacked in the up and down direction, in which a heating module configured to heat a substrate on which a chemical liquid has been coated in the unit block for a resist film, and a heating module configured to heat a substrate on which a developing liquid has been supplied in the unit block for developing are allocated to these heating modules; and an up and down transfer mechanism capable of being moved in the up and down direction so as to transfer a substrate among the heating modules;

in the heating block on the side of the interface block, there are provided: a number of heating modules that are stacked in the up and down direction, in which a heating module configured to heat a substrate on which a chemical liquid has been coated in the unit block for an antireflection film, a heating module configured to heat a substrate on which a chemical liquid has been coated in the unit block for an upper layer film, and a heating module configured to heat an exposed substrate to which a developing liquid is not yet supplied in the unit block for developing are allocated to these heating modules; and an up and down transfer mechanism capable of being moved in the up and down direction so as to transfer a substrate among the heating modules; and the coating and developing apparatus further comprises:

delivery stages respectively arranged on the side of the carrier block of each unit block of the group of unit blocks for coating films, and on the side of the interface block thereof;

delivery stages respectively arranged on the side of the carrier block of the unit block for developing, and on the side of the interface block thereof;

a delivery mechanism configured to deliver a substrate, which has been taken out from the carrier placed on the carrier block, to the delivery stage on the side of the carrier block of the unit block for an antireflection film, and configured to receive a substrate from the delivery stage on the side of the carrier block of the unit block for developing; and a control unit configured to output a control signal in such a manner that a substrate on which a chemical liquid has been coated in the unit block for an antireflection film is delivered to the heating module on the side of the interface block so as to heat the substrate, then the substrate is delivered to the unit block for a resist film so as to coat the substrate with a chemical liquid, then the substrate is delivered to the heating module on the side of the carrier block so as to heat the substrate, then the substrate is delivered to the unit block for an upper layer film so as to coat the substrate with a chemical liquid, and then the substrate is delivered to the heating module on the side of the interface block so as to heat the substrate.

2. The coating and developing apparatus according to claim 1, wherein the up and down transfer mechanism of the heating block on the side of the interface block is divided into an up and down transfer mechanism configured to receive a substrate from the delivery stage corresponding to the unit block for an antireflection film and to deliver a heated substrate to the delivery stage corresponding to the unit block for a resist film, and an up and down transfer mechanism configured to receive a substrate from the delivery stage corresponding to the unit block for an upper layer film.

3. The coating and developing apparatus according to claim 1, wherein:

the main transfer mechanism is shared by the unit block for a resist film and the unit block for an upper layer film, instead of the configuration in which the main transfer mechanism is provided to each of the unit block for a resist film and the unit block for an upper layer film; and the control unit controls the apparatus in such a manner that, when an upper layer film is not formed on a substrate, a substrate on which a chemical liquid has been coated in the unit block for a resist film is delivered, via the delivery stage corresponding to the unit block for an upper layer film, to the heating block on the side of the interface block so as to heat the substrate.

4. A coating and developing method using the coating and developing apparatus according to claim 1, comprising:

coating a substrate with a chemical liquid for forming an antireflection film, in the unit block for an antireflection film;

delivering the substrate on which the chemical liquid has been coated, to the heating module on the side of the interface block and heating the substrate;

delivering the heated substrate to the unit block for a resist film and coating the substrate with a resist liquid;

delivering the substrate on which the resist liquid has been coated, to the heating module on the side of the carrier block and heating the substrate;

delivering the heated substrate to the unit block for an upper layer film and coating the substrate with a chemical liquid for forming an upper layer film; and delivering the substrate on which the chemical liquid has been coated, to the heating module on the side of the interface block and heating the substrate.

5. A non-transitory tangible medium storing a computer program for use in a coating and developing apparatus, the computer program being a program for performing the coating and developing method according to claim 4.

6. A coating and developing apparatus comprising:

a carrier block;

a process block to which a substrate that has been loaded into the carrier block by a carrier is delivered, the process block being configured to form a coating film including a resist film on the substrate;

an interface block arranged on an opposed side of the carrier block with respect to the process block; and an exposure apparatus configured to expose the substrate that has been transferred thereto from the process block via the interface block;

wherein:

the substrate that has been loaded into the carrier block by the carrier is delivered to the process block, a coating film including a resist film is formed on the substrate in the process block, the substrate is transferred to the exposure apparatus via the interface block, the exposed substrate, which has been returned to the process block via the interface block, is developed in the process block, and the developed substrate is delivered to the carrier block;

in the process block, a heating-process related block on the side of the carrier block, a group of liquid-process related unit blocks, and a heating block on the side of the interface block, are arranged in this order from the side of the carrier block to the side of the interface block;

the group of liquid-process related unit blocks are composed of:

a group of unit blocks for coating films that is formed by stacking upward a unit block for an antireflection film configured to form an antireflection film on a substrate, and a unit block for a resist film configured to form a resist film on the antireflection film, in this order; and unit blocks for developing that are stacked on one another in the up and down direction with respect to the group of unit blocks for coating films, each unit block for developing being configured to develop an exposed substrate;

when a direction along which the interface block is seen from carrier block is supposed to be seen from the front, each unit block of the group of unit blocks for coating films includes: a linear transfer path extending in the back and fourth direction; liquid process modules arranged on the right and left sides of the linear transfer path, each liquid process module being configured to supply a substrate with a chemical liquid corresponding to each coating film; and a main transfer mechanism configured to be moved along the linear transfer path so as to transfer a substrate between these liquid process modules;

the unit block for developing includes: a linear transfer path extending in the back and forth direction; developing modules arranged on the right and left sides of the linear transfer path, each developing module being configured to supply a substrate with a developing liquid; and a main transfer mechanism configured to be moved along the linear transfer path so as to transfer a substrate between these developing modules;

the heating-process related block on the side of the carrier block includes: a number of heating modules stacked on one another in the up and down direction, each heating module being configured to heat a substrate to which a developing liquid has been supplied in the unit block for developing; and an up and down transfer mechanism capable of being moved in the up and down direction so as to transfer a substrate among these heating modules;

in the heating block on the side of the interface block, there are provided: a number of heating modules that are stacked in the up and down direction, in which a heating module configured to heat a substrate on which a chemical liquid has been coated in the unit block for an antireflection film, a heating module configured to heat a substrate on which a chemical liquid has been coated in the unit block for a resist film; and a heating module configured to heat an exposed substrate to which a developing liquid is not yet supplied in the unit block for developing are allocated to these heating modules; and an up and down transfer mechanism capable of being moved in the up and down direction so as to transfer a substrate among the heating modules; and the coating and developing apparatus further comprises:

delivery stages respectively arranged on the side of the carrier block of the unit block for an antireflection film, and on the side of the interface block thereof;

delivery stages respectively arranged on the side of the carrier block of the unit block for a resist film, and on the side of the interface block thereof;

delivery stages respectively arranged on the side of the carrier block of the unit block for developing, and on the side of the interface block thereof;

a delivery mechanism configured to deliver a substrate, which has been taken out from the carrier placed on the carrier block, to the delivery stage on the side of the carrier block of the unit block for an antireflection film, and configured to receive a substrate from the delivery stage on the side of the carrier block of the unit block for developing; and a control unit configured to output a control signal in such a manner that a substrate on which a chemical liquid has been coated in the unit block for an antireflection film is delivered to the heating module on the side of the interface block so as to heat the substrate, then the substrate is delivered to the unit block for a resist film so as to coat the substrate with a chemical liquid, and then the substrate is delivered to the heating module on the side of the interface block so as to heat the substrate.

7. A coating and developing method using the coating and developing apparatus according to claim 6, comprising:

delivering a substrate on which a chemical liquid has been coated in the unit block for an antireflection film, to the heating module on the side of the interface block and heating the substrate; and delivering the substrate to the unit block for a resist film and coating the substrate with a chemical liquid, and then delivering the substrate to the heating module on the side of the interface block and heating the substrate.

8. A non-transitory tangible medium storing a computer program for use in a coating and developing apparatus, the computer program being a program for performing the coating and developing method according to claim 7.

\* \* \* \* \*